US006506709B1

(12) United States Patent
Yamazaki

(10) Patent No.: US 6,506,709 B1
(45) Date of Patent: Jan. 14, 2003

(54) DEVICES UTILIZING ORIENTED SUPERCONDUCTING CERAMICS

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 08/471,092

(22) Filed: Jun. 6, 1995

Related U.S. Application Data

(62) Division of application No. 07/590,493, filed on Sep. 27, 1990, now Pat. No. 5,932,524, which is a continuation of application No. 07/159,855, filed on Feb. 24, 1988, now abandoned.

(30) Foreign Application Priority Data

Mar. 23, 1987 (JP) .............................................. 62-69446
Mar. 27, 1987 (JP) .............................................. 62-75203
Mar. 27, 1987 (JP) .............................................. 62-75204

(51) Int. Cl.$^7$ ........................ H01B 12/00; H01L 39/12; C04B 101/00; H01F 6/00

(52) U.S. Cl. ...................................... 505/125; 505/211

(58) Field of Search ........................ 252/521; 505/123, 505/125, 126, 776, 500, 815, 780, 400, 727, 11; 501/123

(56) References Cited

U.S. PATENT DOCUMENTS

| 4,939,121 A | 7/1990 | Rybka |
| 4,975,412 A | 12/1990 | Okazaki et al. ............. 505/725 |
| 5,932,524 A | 8/1999 | Yamazaki |

FOREIGN PATENT DOCUMENTS

| JP | 61-023306 | 1/1986 |
| JP | 61-276305 | 12/1986 |

OTHER PUBLICATIONS

Fisk, Z., et al., "Superconductivity of Rare Earth–Barium–Copper Oxides", Solid State Communications, 62(11), 743–744, Jun. 1987.*
LePage, Y., et al., "Room–temperature structure of the 90–K bulk superconductor YBa2Cu3Og–x", Physical Review B, 35(13), 7245–7248, May 1987.*
C.W. Chu et al., "Evidence for Superconductivity above 40 K in the La–Ba–Cu–O Compound System", The American Physical Society—Review letters, Jan. 26, 1987, pp. 405–407.
M.K. Wu et al., "Superconductivity at 93 K in a New Mixed–Phase Y–Ba–Cu–O Compound System at Ambient Pressure", Physical Review Letters, vol. 58, No. 9, Mar. 2, 1987, pp. 908–910.
Sorimachi et al., Japanese Journal of Applied Science, vol. 26, No. 9, Sep. 1987, pp. L1451–L1452.
Zeitschrift für Physik B—Condensed Matter, vol. 66, No. 3, 10th Mar. 1987, pp. 141–146, Springer–Verlag; C. Politis et al.: "Superconductivity at 40 K in La1.8Sr0.2Cu04", *pp. 141–143, II experimental procedures.
Materials ResearchBulletin, vol. 20, No. 6, 1985, pp. 667–671, Pregamon Press Ltd., C. Michel et al.: "The oxygen defect perovskite BaLa4Cu5O13.4, A Metallic Conductor", *pp. 667–668, paragraph 3.

(List continued on next page.)

Primary Examiner—Mark Kopec
(74) Attorney, Agent, or Firm—Nixon Peabody LLP; Jeffrey S. Costellia

(57) ABSTRACT

A high Tc superconducting ceramic material is produced by a method in which a mixture of chemicals in suitable amounts is compacted into a desired form. The compacted mixture is then fired and, at the same time, an electric current is caused to pass through the compacted mixture in a predetermined direction. By virtue of the passage of the current through the material during firing, the orderliness of the molecular arrangement is enhanced and an elevated transition temperature Tc is obtained.

8 Claims, 2 Drawing Sheets

OTHER PUBLICATIONS

Zeitschrift für Physik B—Condensed Matter, vol. 64, 1986, Springer–Verlag; J.G. Bednorz et al.: "Possible High $T_c$ Superconductivity in the Ba–La–Cu–O System".

Djurek et al., "Sintering of a Mixed Phase Y–Ba–Cu–O in a Pulsed Electric Field," Nov. 15, 1987, pp. 1195–1198, Europhysics Lett., 4 (10).

Saito et al., "Comparison Dependence of the High Temperature Superconductivity in (Ba, Sr)–La–(Hg, Ag)–Cu–O System with K2NiF4 Type Structure," Mar. 1987, pp. L223–224, Japanese Journal of Applied Physics, vol. 26, No. 3.

Uchida et al., "High Tc Superconductivity of La–Ba–Cu Oxides," Jan., 1987, pp. L1–L2, Japanese Journal of Applied Physics, vol. 26, No. 1.

Gallagher, W.J., et al., "Identification and Preparation of Single Phase 90 K Oxide Superconductor and Structural Determinaton by Lattice Imaging", *Solid State Communications*, 63 (2) (Jul. 1987), 147–150.*

Grant, P.M., et al., "Superconductivity above 90 K in the compound $YBa_2Cu_3O_x$", *Physica Review B*, 35 (13) (May 1, 1987).*

LePage, Y., et al., "Room–temperature structure of the 90–K superconductor $YBa_2Cu_3O_{8-x}$", *Physica Review B*, 35(13) (May 1, 1987), 7245–8.*

Tarascon, J.M., et al., "Superconductivity at 90 K in a multiphase oxide of Y–Ba–Cu", *Physica Review B*, 35 (13) (May 1, 1987), 7115–8.*

Engler, E.M. et al., "Superconductivity above Liquid Nitrogen Temperature", *J. Am. Chem. Soc.*, 109 (9) (Apr. 29, 1987), 2848–9.*

Cava, R.J., et al., "Bulk Superconductivity at 91 K in Single–Phase Oxygen–Deficient Perovskite $Ba_2YCu_3O_{9-\delta}$", *Physical Review Letters*, 58 (16) (Apr. 20, 1987), 1676–9.*

Jorgensen J.D., et al., "Lattice Instability and High–Tc Superconductivity in $La_{2-x}Ba_xCuO_4$", *Physical Review Letters*, 58 (10) (Mar. 9, 1987), 1024–7.*

Mattheiss, L.F., "Band Properties and Superconductivity in $La_{2-y}X_yCuO_4$", *Physical Review Letters*, 58 (10) (Mar. 9, 1987), 1028–1030.*

Hor, P.H., et al., "High–Pressure Study of the New Y–Ba–Cu–O Superconducting Compound System", *Physical Review Letters*, 58 (9) (Mar. 2, 1987), 911–2.*

Chu, C.W., et al., "Superconductivity at 52.5 K in the Lanthanum–Barium–Copper–Oxide System", *Science*, 235 (Jan. 30, 1987), 567–9.*

Chu, C.W., et al., "Superconductivity at 40 K in the La–Ba–Cu–O Compound Systems", *Physical Review Letters*, 58 (4) (Jan. 26, 1987), 405–7.*

Bednorz, J.G., et al.,"Possible High Tc Superconductivity in the Ba–La–Cu–O System", *Z. Phys. B—Condensed Matter*, 64 (2) (Sep. 1986), 189–193.*

* cited by examiner

DEVICES UTILIZING ORIENTED SUPERCONDUCTING CERAMICS

This is a Divisional application of Ser. No. 07/590,493, filed Sep. 27, 1990 now U.S. Pat. No. 5,932,524, which itself is a continuation application of Ser. No. 07/159,855, filed Feb. 24, 1988, now abandoned.

BACKGROUND OF THE INVENTION

This invention relates generally to the field of superconducting ceramics and particularly to manufacturing methods for making superconducting ceramics.

It has long been known. that metals such as mercury and lead, intermetallics such as NbNd, $Nb_3Ge$ and $Nb_3Ga$ and ternary materials such as $Nb_3(Al_{0.8}Ge_{0.2})$ demonstrate superconductivity. However, the transition temperature of such long known superconducting materials cannot exceed 25° K.

In more recent years, superconducting ceramics have attracted widespread interest. A new material was first reported by researchers at the Zurich laboratory of IBM Corp. as Ba-La-Cu-0-type high temperature superconducting oxides. Subsequently, La-Sr-Cu(II)-0-type superconducting oxides were also proposed. Another type of superconducting material that has been found is $(YBa_2)Cu_3O_{6-8}$. By virtue of the fact that these superconducting ceramics form a quasi-molecular atomic unit in a crystalline structure whose unit cell is constructed with one layer in which electrons have essentially one-dimensional motion, whereas only three-dimensional electron conduction occurs in the long known materials mentioned above, higher transition temperatures are achieved.

Much work has been undertaken by researches in this field who have endeavoured to elevate Tco, the temperature at which resistance vanishes, above the levels previously obtained and preferably above the boiling point of nitrogen (77° K.) or even higher. As described in our European Patent Application No. 87309081.5 we have investigated superconducting ceramics materials having the stoichiometric formulae $(A_{1-x}B_x)_yCu_zO_w$, where A represents one or more elements of Group IIIb of the Periodic Table, e.g. the rare earth elements, and B represents one or more elements of Group IIa of the Periodic Table, e.g. the alkaline earth elements including beryllium and magnesium, and in the continuation of these investigations we have discovered that the existence of voids and grain boundaries in superconducting ceramic materials makes it difficult to obtain an elevated Tcc.

OBJECTS AND SUMMARY OF THE INVENTION

The present invention thus seeks to provide superconducting ceramics having a higher transition temperature than hitherto and to manufacture superconducting ceramics substantially devoid of imperfections.

Whereas in previous attempts to find higher Tc superconducting materials attention has been focussed upon the composition or molar ratios of the constituent elements, in accordance with the present invention there is principally provided an improved process for the manufacture of superconducting ceramics in accordance with which, during the firing of the raw ceramic constituents, that is to say the chemical compounds which are mixed together to form the superconducting ceramic, an electric current is passed therethrough. By virtue of the passage of this current, it has been found that the ceramic mixture can be given a special orientation in which the atomic arrangement is ordered and made more simple, e.g on the (a,b) plane, so that few grain boundaries and imperfections exist in the final ceramic material.

Whilst the exact mechanism whereby this advantageous effect is obtained is not fully understood, one possibility is that, analogous to the molecular motion which occurs in a magnetic substance in response to the application of a magnetic field thereto, the dipole moments in superconducting ceramics materials may be oriented by the application thereto of an electric field so as to result in a well-arranged structure.

Other features of the invention are set forth with particularity in the appended claims and will become clear to those possessed of the relevant skills from consideration of the following description of exemplary embodiments given with reference to the accompanying drawings.

DETAILED DESCRIPTION OF THE PREFERRED EMBODIMENTS

Figure 1:
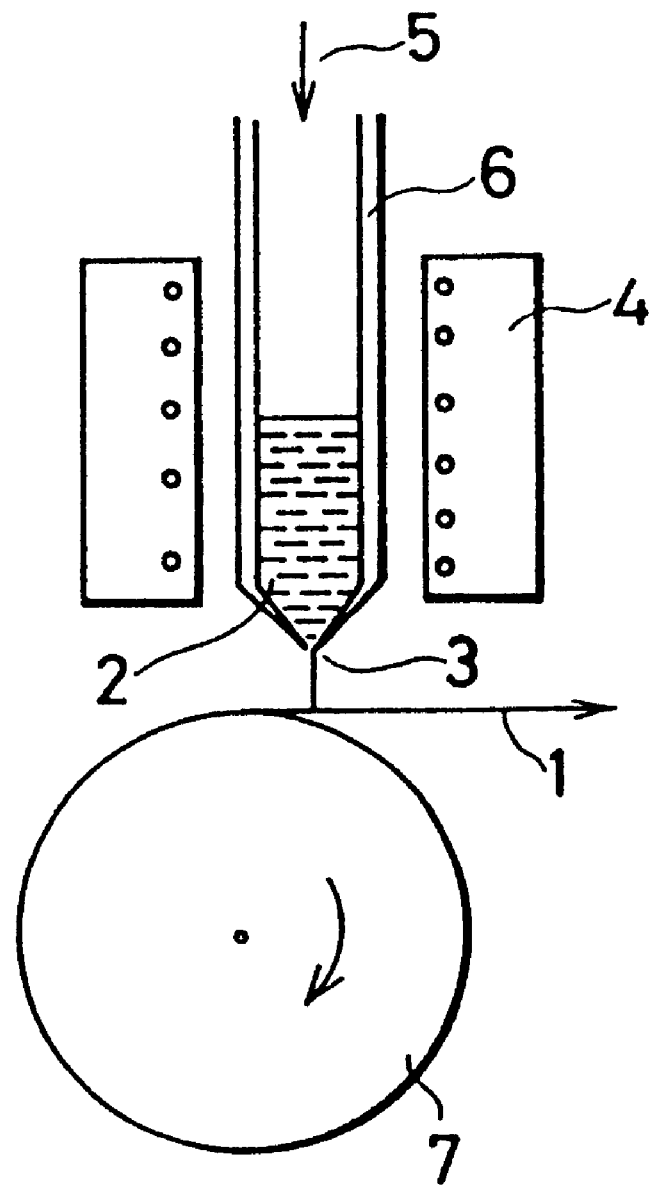
FIG. 1 is a cross sectional view showing an exemplary apparatus used in the manufacture of superconducting ceramics in accordance with the present invention.

First described hereinafter are a number of examples illustrating the manufacture by a method according to the present invention of superconducting ceramics confirming to the stoichiometric formulae $(A_{1-x}B_x)_yCu_zO_w$, where A is one or more elements of Group IIIb of the Periodic Table, e.g. the rare earth elements, B is one or more elements of Group IIa of the Periodic Table, e.g. the alkaline earth metals including beryllium and magnesium, and x=0.1–1.0; y=2.0–4.0 (preferably 2.5–3.5); z=1.0–4.0 (preferably 1.5–3.5); and w=4.0–10.0 (preferably 6.0–8.0).

It will be seen from consideration of these examples that the application of a voltage to a superconducting ceramic material during firing can result in a transition temperature Tc as high as 117° K. The direction in which the voltage was applied was chosen to be coincident with the direction in which current would be desired to pass through the superconducting material in use thereof.

EXAMPLE 1

Prescribed amounts of $BaCO_3$, CuO and $Y_2O_3$ (High Purity Chemical Industries Co.Ltd. 99.95% or higher) were used for preparing a superconducting ceramic material of the above formula where x=0.67, y=3, z=3 and w=6–8, i.e., in conformance with $(YBa_2)_3$ $Cu_3O_{6-8}$. The factor "w" was controlled by adjusting the sintering conditions.

After being mixed in a ball mill, the high purity chemicals were pressed in a capsule at 30 Kg/cm² and formed into a cylindrical shaped tablet of 5 mm diameter and 15 mm height. The tablet was heated (Fired) and oxidized at 500–1200° C., e.g. 700° C., for 8 hours in an oxidizing atmosphere such as in air, this step being called pre-firing hereinafter.

Next, the tablet was finely ground in a ball mill to an average grain diameter of not more than 200 microns and preferably 20 microns or less, e.g. 10 microns or smaller. Then, the powder was pressed in a capsule at 50 Kg/cm² to form a cylindrical tablet again.

The tablets were then fired, hereinafter called main-firing, for 10–50 hours at 500–1200° C., for example 15 hours at 900° C., in an oxidizing atmosphere such as air. At the same time, electric power was applied to the tablet so that pulsed electric current passed through the cylindrical tablet in the axial direction at 0.5–150 A/cm$^2$, for example 8 A/cm$^2$. Namely, the current flowed intermittently through the tablets for about 5 hours with 30 seconds in pulse width and 5 minutes interval between pulses.

Then, the tablets were heated and reduced in an O$_2$ atmosphere with 5–20 atom % Ar at 600–1200° C. for 3–30 hours, for example at 800° C. for 20 hours. The relationship between the temperature and the resistance was investigated, and as a result the highest Tc onset temperature and Tco were measured to be 117° K. and 99° K. respectively.

EXAMPLE 2

The same mixture was prepared as in the previous example. After being mixed in a ball mill, the high purity chemicals were pressed in a capsule at 30 Kg/cm$^2$ and formed into a cylindrical tablet of 5 mm diameter and 15 mm height. The tablet was then pre-fired by being heated and oxidized at 500–1200° C., e.g 700° C., for 8 hours in an oxidizing atmosphere such as in air.

Figure 2:
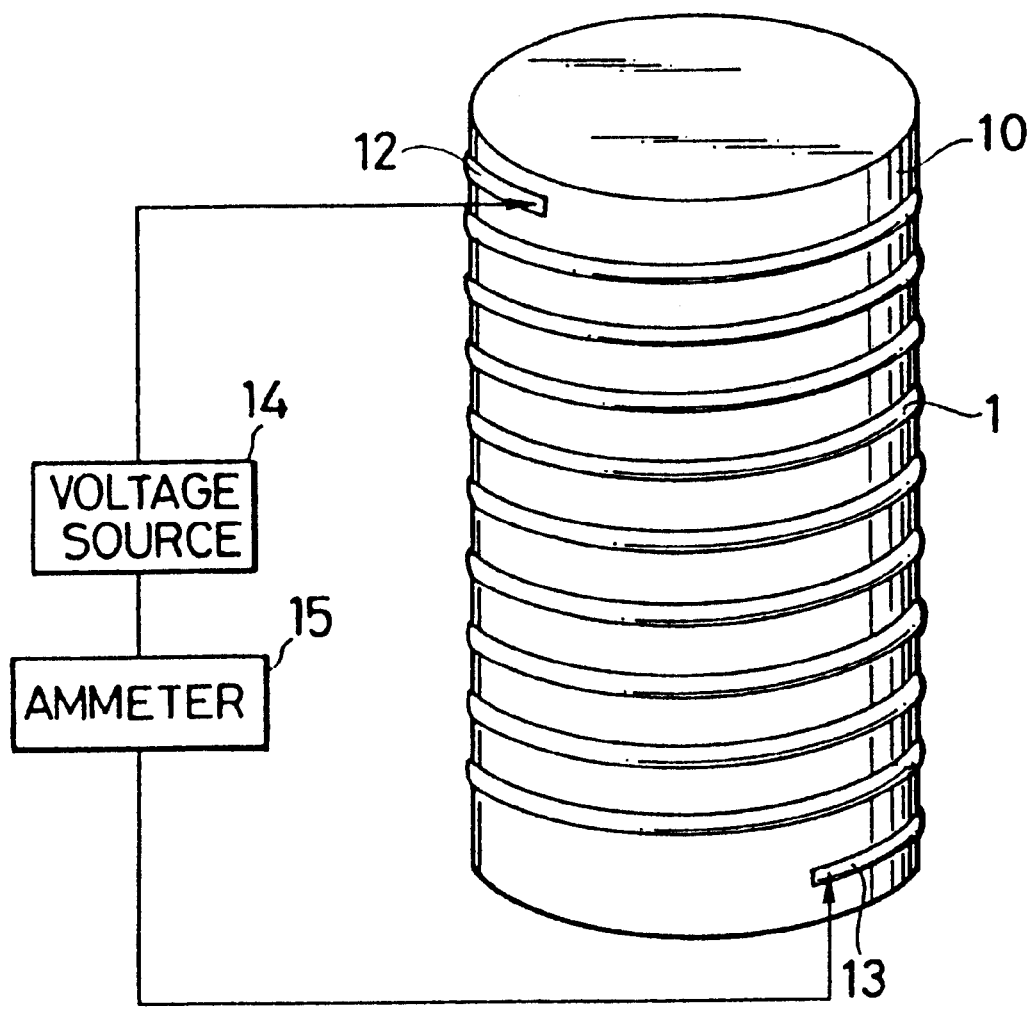
FIG. 2 is a perspective view showing a method of manufacturing a superconducting coil.

Next, the tablet was finely ground in a ball mill to an average grain diameter of not more than 200 microns and preferably 20 microns or less, e.g. 10 microns or smaller. Then, the powder was dispersed into a printing solution and was deposited on the surface of a supporting cylinder by screen press printing, offset printing, intaglio or the like in the form of a coil as illustrated in FIG. 2.

Main-firing was then carried out with the tablets for 10–50 hours, for example 15 hours, at 500–1200° C., e.g. 900° C., in an oxidizing atmosphere such as air. At the same time, electric power was applied to the coils so that pulsed electric current passed through the coils in the axial direction at 0.5–150 A/cm$^2$, for example 8 A/cm$^2$. Namely, the current flowed intermittently through the coils for about 5 hours with 30 seconds in pulse width and 5 minutes interval between pulses.

Then, the coils were heated and reduced in an O$_2$ atmosphere with a 5–20 atoms % Ar at 600–1200° C. for 3–30 hours, for example at 800° C. for 20 hours. The relationship between the temperature and the resistance was Investigated, and as a result the highest Tc onset temperature and Tco were measured to be 95° K. and 79° K. respectively.

EXAMPLE 3

In accordance with this example, Yb and Ba were selected as "A" and "B" of the above formula. The samples were prepared from BaCO$_3$, CuO and Yb$_2$O$_3$ in amounts such as to yield a molar ratio of x=0.67, y=3, z=3 and w=6–8 in the formula, the value of "w" being controlled during oxidation or reducing steps.

The chemicals were mixed together and the mixture 2 was put in a furnace shown in FIG. 1 as comprising a container 6 and a heater 4 and melted at up to 2000° K. The molten material 2 was injected on to the surface of a roll 7 through a nozzle 3 by means of the high pressure of air 5 compressed by means of an air piston (not shown) provided for the container 6, and cooled rapidly in a strip on the surface of the roll 7 which was turned at high speed. The strip was then wound around a supporting cylinder 10 in the form of a coil (multi-layered or single-layered).

The strip 1 was heated and oxidized in an oxidizing atmosphere at 500–1200° C., for example 900° C., and was then reduced for controlling the proportion of oxide (or others) in the product. The firing continued for 3–50 hours, for example 10 hours. An electric current was passed through the strip 1 at 0.5–150 A/cm$^2$ from one end 12 to the other end 13 of the strip 1 by means of a voltage source 14 and an ammeter 15. Because of a comparatively low resistivity of 10$^{-3}$ to 10$^{-5}$ ohm cm$^{-1}$, the resistance of the strip was as low as 1 ohm. The Tco of the strip in the form of a coil was measured to be 98° K. The Tc was 115° K.

EXAMPLE 4

Example 3 was repeated except that the roll 7 was used also as the supporting cylinder, Namely, the melted mixture was cooled and wound up simultaneously by the roll 7. In this example, current treatment was carried out also during the cooling and winding step by applying a voltage between the container 6 and the roll 7 so that a current flow is produced within the molten mixture as it flows from the container 6 onto the roll 7. After the aforementioned firing described in Example 3 was completed, there was obtained a superconducting coil whose Tc onset temperature was improved by a further 3–5° K.

For enhancing the layered arrangement of the copper atoms in the crystalline structure according to this embodiment, small quantities of elements from Group IIIa of the Periodic Table may be mixed additionally into the mixture. With this addition, voids or other imperfections can be eliminated almost perfectly and therefore the Tc onset and the Tco can be elevated further.

There will now be described below examples of the manufacture by a process according to the present invention of superconducting ceramic materials according to the stoichiometric formula generally expressed by $(A_{1-x}B_x)_y CuO_z$, where A is one or more elements of Group IIIb of the Periodic Table, e.g. the rare earth elements, B is one or more elements of Group IIa of the Periodic Table, e.g. the alkaline earth metals including beryllium and magnesium and wherein x=0.01–0.3, y=1.0–2.2, and z=2.0–4.5. With this molar ratio, superconducting ceramics are formed in a double layered symmetric structure, such as a K$_2$NiF$_4$ structure or a perovskite-like structure modified therefrom. High purity (99.9% or 99.99%) oxides and/or carbonates are used as starting materials and are ground into fine powders and mixed together so that the prescribed molar ratios of x, y and z can be obtained.

EXAMPLE 5

Prescribed amounts of BaCO$_3$, CuO and Y$_2$O$_3$ (High Purity Chemical Industries Co.Ltd. 99.95% or higher) were used for preparing a superconducting material of the above formula where x–0.08 and y=1.8. This example was repeated with varying values of "x" ranging from 0.01 to 0.3, i.e. 0.05, 0.1, 0.15, and 0.2.

After being mixed in a ball mill, the high purity chemicals were pressed in a capsule at 3 Kg/cm$^2$ and formed into a cylindrical tablet of 5 mm diameter and 15 mm height. The tablet was pre-fired by being heated and oxidized at 500–1200° C., e.g. 700° C., for 8 hours in an oxidizing atmosphere such as in air.

Next, the tablet was finely ground in a ball mill to an average grain diameter of not more than 200 microns and preferably 20 microns or less, e.g. 10 microns or smaller. Then, the powder was pressed in a capsule at 50 Kg/cm$^2$ and formed into a cylindrical tablet again.

Main-firing was then carried out for 10–50 hours at 500–1200° C., for example 15 hours at 900° C., in an oxidizing atmosphere such as air. At the same time, electric power was applied to the tablet so that pulsed electric current was passed through the cylindrical tablet in its axial direction at 0.5–150 A/cm$^2$, for example 8 A/cm$^2$. Namely, the current flowed intermittently through the tablets for about 5 hours with 30 seconds pulse width and 5 minutes interval between pulses.

This tablet was observed mainly to have a perovskite-like structure, but a $K_2NiF_4$ structure was also found at the same time.

Then, the tablets were heated and reduced in an $O_2$ atmosphere with a 5–20 atom % Ar at 600–1200° C. for 3–30 hours, for example at 800° C. for 20 hours. The relationship between the temperature and the resistance was investigated, and as a result the highest Tc onset temperature and Tco were measured to be 103° K. and 81° K. respectively. After this reduction treatment, the presence of a $K_2NiF_4$ structure was conspicuously evident.

EXAMPLE 6

The procedure of Example 5 was repeated but with 50% of Y substituted by Yb and with a current density of 2 A/cm$^2$. The Yb was introduced as an oxide. As a result, Tc onset was measured to be 107° K. and Tco was 84° K.

EXAMPLE 7

The procedure of Example 6 was repeated but with $Nb_2O_5$ added to Y and Yb at 20–30% and with a suitable current which caused heat during the firing in order to elevate the temperature of the sample due to the current averagely by 50–300° C., for example 150° C. By virtue of these changes Tc was further elevated by 3–5° K.

The foregoing Examples are merely illustrative of the invention and do not include all of the combinations of elements and process variations which may be used to produce superconducting ceramics materials in accordance with the invention, other combinations also being effective to provide improved superconducting materials. While several embodiments have been specifically described, it is to be appreciated that the present invention is not limited to the particular examples described and that modifications and variations can be made without departure from the scope of the invention as defined by the appended claims. For example, a hollow cylinder may be used in place. of the supporting cylinder 10 of FIG. 2 and the inside surface of the cylinder may be coated with the superconductor so as to constitute a cooling surface whereupon the main-firing step and at the same time the current flowing step are effected.

Furthermore, although pulsed current passing through the ceramic material in one direction is used in the described embodiments, the pulses could be passed alternately in opposite directions and alternating current or direct current can be also used.

What is claimed is:

1. A device comprising a copper oxide superconducting material through which current passes in a predetermined direction, wherein crystalline structures of said material are substantially aligned with said predetermined direction.

2. The device of claim 1 wherein said copper oxide superconducting material is represented by a stoichiometric formula $(A_{1-x}B_x)_y Cu_z O_w$, where A is one or more elements selected from rare earth metals, B is one or more elements selected from alkaline earth metals, and x=0.1–1.0, y=2.0–4.0, z=1.0–4.0 and w=4.0–10.0.

3. A device comprising a copper oxide superconducting material through which current passes in a predetermined direction, said material having a layered arrangement of copper atoms in a crystal structure thereof, wherein said layered arrangement of copper atoms is aligned with said predetermined direction.

4. The device of claim 3 wherein said copper oxide superconducting material is represented by a stoichiometric formula $(A_{1-x}B_x)_y Cu_z O_w$, where A is one or more elements selected from rare earth metals, B is one or more elements selected from alkaline earth metals, and x=0.1–1.0, y=2.0–4.0, z=1.0–4.0 and w–4.0–10.0.

5. A superconducting device comprising a copper oxide superconducting material having a crystalline structure, wherein a–b planes of said crystalline structure are oriented along an intended carrier flow direction through said superconducting material.

6. A superconducting device according to claim 5, wherein said copper oxide superconducting material forms a coil.

7. A superconducting device comprising a copper oxide superconducting material having a crystalline structure, wherein said crystalline structure is oriented along an intended carrier flow direction through said superconducting material.

8. A superconducting device comprising a copper oxide superconducting material having a layered arrangement of copper atoms in a crystal structure thereof, wherein said layered arrangement of copper atoms is substantially oriented along an intended carrier flow direction through said superconducting material.

* * * * *